(12) United States Patent
Arifuku et al.

(10) Patent No.: US 8,115,322 B2
(45) Date of Patent: Feb. 14, 2012

(54) ADHESIVE, METHOD OF CONNECTING WIRING TERMINALS AND WIRING STRUCTURE

(75) Inventors: Motohiro Arifuku, Ibaraki (JP); Itsuo Watanabe, Ibaraki (JP); Kouji Motomura, Ibaraki (JP); Kouji Kobayashi, Ibaraki (JP); Yasushi Gotoh, Ibaraki (JP); Tohru Fujinawa, Ibaraki (JP)

(73) Assignee: Hitachi Chemical Company, Ltd., Tokyo (JP)

(*) Notice: Subject to any disclaimer, the term of this patent is extended or adjusted under 35 U.S.C. 154(b) by 0 days.

(21) Appl. No.: 12/874,945

(22) Filed: Sep. 2, 2010

(65) Prior Publication Data
US 2010/0330364 A1 Dec. 30, 2010

Related U.S. Application Data

(62) Division of application No. 12/139,306, filed on Jun. 13, 2003, which is a division of application No. 11/074,704, filed on Mar. 9, 2005, now Pat. No. 7,777,335, which is a division of application No. 10/069,273, filed as application No. PCT/JP00/05766 on Aug. 25, 2000, now Pat. No. 6,939,913.

(30) Foreign Application Priority Data

Aug. 25, 1999 (JP) ..................... 11-238408

(51) Int. Cl.
- *C09J 9/02* (2006.01)
- *C09J 4/06* (2006.01)
- *H01B 1/20* (2006.01)
- *H05K 3/36* (2006.01)
- *H05K 3/32* (2006.01)
- *H01L 21/60* (2006.01)

(52) U.S. Cl. ......... 257/783; 257/E23.018; 257/E21.514; 257/758; 257/668; 257/746; 524/730; 524/731; 524/785; 524/780; 524/853; 252/512; 438/118; 438/119

(58) Field of Classification Search .................. 257/783, 257/750, 753, 746, E23.018, E21.514, 668, 257/758; 156/329; 252/521.3, 512; 428/355 R; 524/261, 730, 731, 785, 780; 438/118, 119
See application file for complete search history.

(56) References Cited

U.S. PATENT DOCUMENTS 4,369,300 A * 1/1983 Carter et al. .................. 528/28
4,680,226 A 7/1987 Takeda
(Continued)

FOREIGN PATENT DOCUMENTS
JP 59-004611 1/1984
(Continued)

OTHER PUBLICATIONS

Japanese Official Action for Application No. P2001-518803, dated Apr. 4, 2005.
(Continued)

*Primary Examiner* — A O Williams
(74) *Attorney, Agent, or Firm* — Antonelli, Terry, Stout & Kraus, LLP.

(57) ABSTRACT

This invention provides a wiring-terminal-connecting adhesive comprising a curing agent capable of generating a free radical upon heating, a radically polymerizable substance and silicone particles, and a wiring-terminal-connecting method and a wiring structure which make use of such an adhesive.

13 Claims, 3 Drawing Sheets

U.S. PATENT DOCUMENTS

| | | | |
|---|---|---|---|
| 4,933,744 A | 6/1990 | Segawa et al. | |
| 5,183,969 A | 2/1993 | Odahima | |
| 5,229,037 A | 7/1993 | Nakano et al. | |
| 5,292,583 A * | 3/1994 | Taki et al. | 428/32.66 |
| 5,354,397 A | 10/1994 | Miyake et al. | |
| 5,536,568 A | 7/1996 | Teruo | |
| 5,672,400 A | 9/1997 | Hansen et al. | |
| 5,700,756 A * | 12/1997 | Pack | 503/227 |
| 5,744,557 A | 4/1998 | McCormick et al. | |
| 5,858,806 A | 1/1999 | Nishida | |
| 5,869,421 A | 2/1999 | Kutami et al. | |
| 5,907,190 A | 5/1999 | Ishikawa et al. | |
| 5,965,064 A | 10/1999 | Yamada et al. | |
| 5,989,304 A | 11/1999 | Ozaki et al. | |
| 6,005,017 A | 12/1999 | Daly et al. | |
| 6,017,587 A | 1/2000 | Kleyer et al. | |
| 6,039,896 A | 3/2000 | Miyamoto et al. | |
| 6,048,949 A * | 4/2000 | Muthiah et al. | 525/438 |
| 6,115,171 A | 9/2000 | Minami et al. | |
| 6,164,785 A | 12/2000 | Maekawa | |
| 6,223,429 B1 | 5/2001 | Kaneda et al. | |
| 6,284,817 B1 * | 9/2001 | Cross et al. | 523/220 |
| 6,319,878 B1 | 11/2001 | Ina et al. | |
| 6,441,092 B1 | 8/2002 | Gieselman | |
| 6,517,744 B1 | 2/2003 | Hara et al. | |
| 6,602,603 B2 * | 8/2003 | Welch et al. | 428/412 |
| 6,692,611 B2 | 2/2004 | Oxman et al. | |
| 6,762,249 B1 | 7/2004 | Fujinawa et al. | |
| 6,809,280 B2 | 10/2004 | Divigalpitiya et al. | |
| 6,884,833 B2 * | 4/2005 | Chheang et al. | 524/445 |
| 6,906,541 B2 | 6/2005 | Kimura | |
| 6,939,913 B1 | 9/2005 | Arifuku et al. | |
| 7,071,722 B2 | 7/2006 | Yamada et al. | |
| 7,141,645 B2 | 11/2006 | Fujinawa et al. | |
| 7,144,956 B2 * | 12/2006 | Attarwala et al. | 525/167 |
| 7,241,644 B2 | 7/2007 | Arifuku et al. | |
| 7,258,918 B2 | 8/2007 | Tsukagoshi et al. | |
| 7,276,400 B2 | 10/2007 | Fjelstad | |
| 7,535,462 B2 | 5/2009 | Spath et al. | |
| 7,604,868 B2 | 10/2009 | Watanabe et al. | |
| 2001/0016257 A1 * | 8/2001 | Bennett et al. | 428/355 R |
| 2002/0081777 A1 | 6/2002 | Fjelstad | |
| 2003/0165666 A1 | 9/2003 | Fujiwara et al. | |
| 2003/0236362 A1 | 12/2003 | Bluem et al. | |
| 2004/0214979 A1 | 10/2004 | Fujinawa et al. | |
| 2004/0222408 A1 | 11/2004 | Watanabe et al. | |
| 2004/0248015 A1 | 12/2004 | Kamikoriyama et al. | |
| 2005/0118939 A1 | 6/2005 | Duescher | |
| 2005/0178502 A1 | 8/2005 | Arifuku et al. | |
| 2006/0014860 A1 | 1/2006 | Watanabe et al. | |
| 2006/0060969 A1 | 3/2006 | Watanabe et al. | |
| 2006/0063366 A1 | 3/2006 | Watanabe et al. | |

FOREIGN PATENT DOCUMENTS

| | | |
|---|---|---|
| JP | 05-140510 | 6/1993 |
| JP | 05-145510 | 6/1993 |
| JP | 05-347464 | 12/1993 |
| JP | 07-090028 | 4/1995 |
| JP | 09-100326 | 4/1997 |
| JP | 10-120983 | 5/1998 |
| JP | 10-150007 | 6/1998 |
| JP | 10-178251 | 6/1998 |
| JP | 10-273630 | 10/1998 |
| JP | 10-316959 | 12/1998 |
| JP | 10-338853 | 12/1998 |
| JP | 2865534 | 12/1998 |
| JP | 11-061060 | 3/1999 |
| JP | 11-097482 | 4/1999 |
| JP | 11-097825 | 4/1999 |
| JP | 11-140387 | 5/1999 |
| JP | 11-148058 | 6/1999 |
| JP | 11-256117 | 9/1999 |
| JP | 11-335641 | 12/1999 |
| WO | WO 98/44067 | 10/1998 |

OTHER PUBLICATIONS

"Silicone Handbook", The Nikkan Kogyo Shinbun, Ltd., Aug. 3, 1990, pp. 292-298.

Notice of Allowance and Fee(s) Due, with attachments including Notice of Allowability, for U.S. Appl. No. 11/074,718, dated Feb. 12, 2007.

Japanese Official Action, for Application No. 2001-518803, dated Mar. 6, 2007.

Official Action, issued Jun. 23, 2006, for Chinese Application No. 008119015.

European Office Action, for Application No. 00 955 040.1, dated Feb. 25, 2005 (5 pp.).

Supplementary European Search Report, transmitted Sep. 19, 2002, for EP 00 95 5040.

Japanese Official Action issued on Apr. 1, 2009, for Application No. 2005-162975.

U.S. Notice of Allowance mailed Mar. 11, 2010, for U.S. Appl. No. 11/074,704, filed Mar. 9, 2005.

U.S. Office Action mailed Mar. 29, 2011, for U.S. Appl. No. 12/874,921.

U.S. Office Action mailed Sep. 8, 2011, for U.S. Appl. No. 12/874,921.

U.S. Office Action (Notice of Allowance) dated Oct. 25, 2011, for U.S. Appl. No. 12/139,306.

* cited by examiner

ADHESIVE, METHOD OF CONNECTING WIRING TERMINALS AND WIRING STRUCTURE

This application is a Divisional application of application Ser. No. 12/139,306, filed Jun. 13, 2008, which is a Divisional application of application Ser. No. 11/074,704, filed Mar. 9, 2005, now U.S. Pat. No. 7,777,335, issued Aug. 17, 2010, which application Ser. No. 11/074,704 is a Divisional application of application Ser. No. 10/069,273, submitted May 23, 2002, now U.S. Pat. No. 6,939,913, issued Sep. 6, 2005, which is an application submitted under 35 USC 371 of International (PCT) Application No. PCT/JP00/05766, filed Aug. 25, 2000. The contents of Ser. No. 10/069,273, submitted May 23, 2002, are incorporated herein by reference in their entirety. This application is related to application Ser. No. 11/074,718, filed Mar. 9, 2005, now U.S. Pat. No. 7,241,644, issued Jul. 10, 2007.

TECHNICAL FIELD

This invention relates to a wiring-connecting adhesive, and a wiring-terminal-connecting method and a wiring structure which make use of such an adhesive.

BACKGROUND ART

In recent years, wiring density is being made higher in the field of precision electronic machinery, so that electrodes are formed in very small width and distance. Hence, there is a possibility that the wiring may fall off, come off or come to misregistration. To solve this problem, adhesive compositions for electric and electronic use which have a good low-temperature curability and having a pot life have been developed (e.g., Japanese Patent Application Laid-open No. 11-97825).

However, conventional wiring and connecting members have had a problem that they differ in bond strength depending on the type of materials constituting the wiring to be connected. In particular, where the substrate which supports wiring terminals is made of an insulating organic material such as polyimide resin, or glass, or where silicon nitride, silicone resin or polyimide resin is coated or stays attached at the surface of a wiring member, there has been the problem of a very low bond strength.

DISCLOSURE OF THE INVENTION

An object of the present invention it to provide an adhesive which is suited for electric and electronic use and can achieve a high bond strength especially even when it bonds a wiring member in which the substrate which supports wiring terminals is made of an insulating organic matter or glass, or a wiring member having silicon nitride, silicone resin and/or polyimide resin at its surface at least in part, and provide a wiring-terminal-connecting method and a wiring structure which make use of such an adhesive.

The present invention provides a wiring-terminal-connecting adhesive comprising (1) a curing agent capable of generating a free radical upon heating, (2) a radically polymerizable substance and (3) silicone particles. The adhesive of the present invention can be used to connect terminals electrically by interposing the adhesive between wiring substrates which are so disposed that wiring terminals provided on their surfaces face to one another, and heating these wiring substrates under application of a pressure. In the present invention, the terminals may also be electrodes.

The adhesive of the present invention may further comprise (4) a film-forming material. As the film-forming material, phenoxy resin is preferred.

The adhesive of the present invention may still further comprise (5) conductive particles. The conductive particles may preferably be composed of at least one of gold, silver and a platinum group metal at least at their surfaces.

The silicone particles in the adhesive of the present invention may preferably be contained in an amount of from 5 to 200 parts by weight based on 100 parts by weight of the radically polymerizable substance (when the film-forming material is contained, based on 100 parts by weight of the total of the radically polymerizable substance and the film-forming material).

The silicone particles used in the adhesive of the present invention may also preferably have a modulus of elasticity of from 0.1 to 100 MPa at 25° C. (room temperature).

The present invention also provides a wiring-terminal-connecting adhesive film comprising a first layer formed of a composition containing (1) a curing agent capable of generating a free radical upon heating, (2) a radically polymerizable substance and (3) silicone particles; and a second layer formed of a composition containing (5) conductive particles, (2) a radically polymerizable substance and (3) silicone particles, wherein the first and second layers are formed in layers.

The present invention still also provides a method of connecting wiring terminals, comprising interconnecting connecting terminals electrically with the adhesive of the present invention, wherein at least two wiring members have the connecting terminal individually.

The connecting method of the present invention is a method in which a first wiring member having a first connecting terminal and a second wiring member having a second connecting terminal which are so disposed that the terminals face to each other in the state the adhesive of the present invention is interposed between them are heated under application of a pressure in the direction of bonding to connect the first connecting terminal and the second connecting terminal electrically.

The connecting method of the present invention is especially suited when at least one of the connecting terminals has a surface which is formed of at least one of gold, silver, tin, a platinum group metal and/or indium-tin oxide (ITO). The connecting method of the present invention is also suited when at least one of the wiring members has a substrate comprising an insulating organic material and/or glass. Moreover, the connecting method of the present invention can achieve a superior bond strength even when at least one of the wiring members has at least one of silicon nitride, silicone resin and polyimide resin at its surface.

The present invention further provides a wiring structure comprising at least two wiring members which have a connecting terminal individually, wherein the connecting terminals of the wiring members are electrically interconnected with the adhesive of the present invention.

The wiring structure of the present invention has a structure in which a first wiring member having a first connecting terminal and a second wiring member having a second connecting terminal are so disposed that the first connecting terminal and the second connecting terminal face to each other in the state the adhesive of the present invention is interposed between them, and the first connecting terminal and the second connecting terminal are electrically connected.

BEST MODES FOR PRACTICING THE INVENTION (1) Curing Agent Capable of Generating a Free Radical: Upon Heating The curing agent capable of generating a free radical upon heating, contained in the adhesive of the present invention, is a substance which undergoes decomposition upon heating to generate a free radical, as exemplified by a peroxide or an azo compound. This curing agent may appropriately be selected taking account of the intended connecting temperature, connecting time, pot life and so forth. In view of the highness of reactivity and the length of pot life, the curing agent may preferably be an organic peroxide having a temperature of 40° C. or above for the 10-hour half-life and a temperature of 180° C. or below for the 1-minute half-life, and more preferably an organic peroxide having a temperature of 60° C. or above for the 10-hour half-life and a temperature of 170° C. or below for the 1-minute half-life.

When connected in a time of 10 seconds or less, the curing agent may preferably be mixed in an amount of from 0.1 to 30 parts by weight, and more preferably from 1 to 20 parts by weight, based on 100 parts by weight of the radically polymerizable substance (when the film-forming material is contained, based on 100 parts by weight of the total of the radically polymerizable substance and the film-forming material) in order to achieve a sufficient rate of reaction. If the curing agent is mixed in an amount of less than 0.1 part by weight, any sufficient rate of reaction can not be achieved to tend to make it difficult to achieve a good bond strength and a low connection resistance.

If it is mixed in an amount of more that 30 parts by weight, the adhesive may have a low flowability or a high connection resistance, and the adhesive tends to have a short lifetime.

Curing agents preferable for the present invention may include diacyl peroxides, peroxydicarbonates, peroxy esters, peroxy ketals, dialkyl peroxides, hydroperoxides and silyl peroxides.

In order to keep the connecting terminals of the wiring member from corroding, any chloride ion or organic acid contained in the curing agent may preferably be not more than 5,000 ppm. Those in which any organic acid generated after thermal decomposition can be in a small content are more preferred. Stated specifically, peroxy esters, dialkyl peroxides, hydroperoxides, silyl peroxides, and the like are preferred. In particular, it is preferable to select the curing agent from peroxy esters, which can achieve a high reactivity. Of these curing agents, any one compound may be used alone, or two or more compounds may be used in appropriate combination.

Peroxy esters preferable for the present invention may include cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxypivarate, 1,1,3,3-tetramethylbutyl peroxy-2-ethylhexanonate, 2,5-dimethyl-2,5-di(2-ethylhexanoylperoxy)hexane, 1-cyclohexyl-1-methylethyl peroxy-2-ethylhexanonate, t-hexyl peroxy-2-ethylhexanonate, t-butyl peroxy-2-ethylhexanonate, t-butyl peroxyisobutyrate, 1,1-bis(t-butylperoxy)cyclohexane, t-hexyl peroxy-isopropylmonocarbonate, t-butyl peroxy-3,5,5-trimethylhexanonate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, t-butyl peroxyacetate and the like.

Dialkyl peroxides preferable for the present invention may include α,α'-bis(t-butylperoxy)diisopropylbenzene, dicumyl peroxide, 2,5-dimethyl-2,5-di(t-butylperoxy)hexane, t-butyl cumyl peroxide and the like.

Hydroperoxides preferable for the present invention may include diisopropylbenzene hydroperoxide, cumene hydroperoxide, and the like.

Diacyl peroxides preferable for the present invention may include isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoyl peroxytoluene, benzoyl peroxide and the like.

Peroxydicarbonates preferable for the present invention may include di(n-propyl) peroxydicarbonate, di(isopropyl) peroxydicarbonate, bis(4-t-butylcyclohexyl) peroxydicarbonate, di(2-ethoxyethyl) peroxydicarbonate, di(2-ethylhexyl) peroxydicarbonate, di(methoxybutyl) peroxydicarbonate, di(3-methyl-3-methoxybutyl) peroxydicarbonate and the like.

Peroxy ketals may include
1,1-bis(t-hexylperoxy)-3,3,5-trimethylcyclohexane,
1,1-bis(t-hexylperoxy)cyclohexane,
1,1-bis(t-butylperoxy)-3,3,5-trimethylcyclohexane,
1,1-bis(t-butylperoxy)cyclododecane,
2,2-bis(t-butylperoxy)decane and the like.

Silyl peroxides may include t-butyltrimethylsilyl peroxide, bis(t-butyl)dimethylsilyl peroxide, t-butyltrivinylsilyl peroxide, bis(t-butyl)divinylsilyl peroxide, tris(t-butyl)vinylsilyl peroxide, t-butyltriallylsilyl peroxide, bis(t-butyl)diallylsilyl peroxide, tris(t-butyl)allylsilyl peroxide and the like.

Of these curing agents capable of generating free radicals upon heating, any one compound may be used alone, or two or more compounds may be used in combination. Also, any of these curing agents may be used in combination with a decomposition accelerator, an inhibitor and so forth.

These curing agents may be coated with a polyurethane type or polyester type polymeric compound so as to be made into microcapsules. Such curing agents are also preferable for the present invention because the pot life can be made longer.

(2) Radically Polymerizable Substance:

The radically polymerizable substance to be contained in the adhesive of the present invention is a substance having a functional group which can polymerize by the action of radicals. This radically polymerizable substance may include acrylates, methacrylates, maleimide compounds and the like, which may be in the state of either of monomers and oligomers. A monomer and an oligomer may also be used in combination.

As specific examples of acrylates and methacrylates preferable for the adhesive of the present invention, they may include methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(acryloxymethoxy)phenyl]propane, 2,2-bis[4-(acryloxypolyethoxy)phenyl]propane, dicyclopentenyl acrylate, tricyclodecanyl acrylate, tris(acryloyloxyethyl) isocyanurate, urethane acrylate, etc., and methacrylates corresponding to these.

Maleimide compounds preferable for the adhesive of the present invention are those having at least two maleimide groups in the molecule. Such maleimide compounds may include, e.g., 1-methyl-2,4-bismaleimidobenzene, N,N'-m-phenylenebismaleimide, N,N'-p-phenylenebismaleimide,

N,N'-m-toluoylenebismaleimide, N,N'-4,4-biphenylenebismaleimide, N,N'-4,4-(3,3'-dimethyl-biphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-3,3'-diphenylsulfonebismaleimide, N,N'-4,4-diphenyl ether bismaleimide, 2,2-bis{4-(4-maleimidophenoxy)phenyl}propane, 2,2-bis{3-s-butyl-4,8-(4-maleimidophenoxy)phenyl}propane, 1,1-bis{4-(4-maleimidophenoxy)phenyl}decane, 4,4'-cyclohexylidene-bis{1-(4-maleimidophenoxy)phenyl}-2-cyclohexylbenzene, 2,2-bis{4-(4-maleimidophenoxy)phenyl}hexafluoropropane and the like.

Of these radically polymerizable substances, compounds having at least one of a dicyclopentenyl group, a tricyclodecanyl group and a triazine ring are preferred because adhesive cured products can be improved in heat resistance.

Of these radically polymerizable substances, any one may be used alone or two or more may be used in combination.

If necessary, a polymerization inhibitor such as hydroquinones or methyl ether hydroquinones may appropriately be used.

The radically polymerizable substance described above may also be used in combination with a radically polymerizable substance having a phosphoric ester structure represented by the following chemical formula (I). This is preferable because the bond strength on the surface of inorganic matter such as metal is improved.

(I)

wherein n is 1, 2 or 3.

Such a radically polymerizable substance having a phosphoric ester structure can be obtained by allowing phosphoric anhydride to react with 2-hydroxyethyl acrylate or methacrylate. It may specifically include mono(2-methacryloyloxyethyl) acid phosphate, di(2-methacryloyloxyethyl) acid phosphate and the like. Of these, any one compound may be used alone, or two or more may be used in combination.

The radically polymerizable substance having a phosphoric ester structure may preferably be mixed in an amount of from 0.01 to 50 parts by weight, and more preferably from 0.5 to 5 parts by weight, based on 100 parts by weight of the total weight of the radically polymerizable substance(s) (when the film-forming material is contained, based on 100 parts by weight of the total of the radically polymerizable substance(s) and the film-forming material).

If it is less than 0.01 part by weight, the bond strength to the surface of inorganic matter such as metal may be improved with difficulty. If it is more than 50 parts by weight, the expected curing performance may not be achieved.

(3) Silicone Particles:

The silicone particles may be obtained by a method in which, e.g., a silane compound (such as a methyltrialkoxysilane or a partial hydrolysis-condensation product thereof) is added to an aqueous alcohol solution the pH of which has been adjusted with sodium hydroxide or ammonia to more than 9 and the mixture formed is hydrolyzed to effect polycondensation, or may be obtained by, e.g., copolymerization of an organosiloxane.

In the adhesive of the present invention, silicone particles having a functional group such as a hydroxyl group, an epoxy group, a ketimine, a carboxyl group or a mercapto group at the molecular terminal or on the side chain in the molecule are preferred because the dispersibility in the film-forming material and radically polymerizable substance(s) can be improved.

In the present invention, the incorporation of the silicone particles in the adhesive enables achievement of a very high bond strength even on the wiring member in which the substrate which supports connecting terminals is made of an insulating organic matter or glass, or on the wiring member having silicon nitride, silicone compound or polyimide resin at its surface. Also, in the case when the adhesive is made into a film by the use of the film-forming material, the film is improved in its releasability from a base material, and hence is improved in transfer performance on electronic materials which are to be bonded with such a film adhesive.

In the present invention, spherical or amorphous fine particles may be used as the silicone particles, and fine particles with an average particle diameter of from 0.1 μm to 20 μm may preferably be used. Also preferred are silicone particles in which particles not larger than the average particle diameter hold 80% by weight or more of the particle size distribution of the fine particles. Silicone particles the particle surfaces of which have been treated with a silane coupling agent are particularly preferred because the dispersibility in the resin is improved.

The silicone particles used in the adhesive of the present invention may preferably have a modulus of elasticity of from 0.1 to 100 MPa at room temperature (25° C.), and more preferably from 1 to 30 MPa in order to improve the dispersibility of the particles or to lessen the interfacial stress acting at the time of connection. Incidentally, the modulus of elasticity as defined herein is the modulus of elasticity of silicone rubber obtained by polymerizing the silane compound (such as an alkoxysilane or a partial hydrolysis-condensation product thereof) which is a material for the silicone particles, and is measured by dynamic extended viscoelastometry.

The silicone particles may directly be mixed in the radically polymerizable substance, the curing agent capable of generating a free radical upon heating or the film-forming material. Since, however, the former is readily dispersible in the film-forming material or radically polymerizable substance, the former may preferably be mixed with the latter after the former has been dispersed in an organic solvent.

The silicone particles may be mixed in an amount of from 5 to 200 parts by weight, and more preferably from 10 to 50 parts by weight, based on 100 parts by weight of the total weight of the radically polymerizable substance(s) (when the film-forming material is contained, based on 100 parts by weight of the total of the radically polymerizable substance(s) and the film-forming material). If the silicone particles are less than 5 parts by weight, the good bond strength to the substrate which supports connecting terminals and to the wiring member surface and the releasability from the base material may be less achievable.

If on the other hand the silicone particles are more than 200 parts by weight, the adhesive may have a low cohesive force and hence there is a possibility that any good adhesive can not be obtained.

(4) Film-Forming Material:

Film-forming materials preferable for the present invention may include polyvinyl formal resin, polystyrene resin, polyvinyl butyral resin, polyester resin, polyamide resin, xylene resin, phenoxy resin and polyurethane resin.

The film-forming material refers to a material which can make the adhesive be handled as a film in a usual condition when a liquid composition is solidified into a film, i.e., a material which imparts good mechanical properties as film (the properties that the film formed can be handled with ease and the film does not split, break or become tacky) to the film to be formed. In view of the readiness to handle as a film, a material capable of forming a self-supporting film is preferred.

Among compounds which can impart such properties, it is preferable to use phenoxy resin, as having superior adhesion, compatibility, heat resistance and mechanical strength. The phenoxy resin is obtained by allowing a bifunctional phenol to react with an epihalohydrin to a product with a high molecular weight, or by subjecting a bifunctional epoxy resin and a bifunctional phenol to polyaddition.

Stated specifically, it can be obtained by, e.g., allowing 1 mol of a bifunctional phenol to react with 0.985 to 1.015 mol of an epihalohydrin in the presence of an alkali metal hydroxide in an inactive solvent at 40 to 120° C.

From the viewpoint of the mechanical properties and thermal properties of the resin, particularly preferred is a product obtained by subjecting to polyaddition reaction a bifunctional epoxy resin and a bifunctional phenol in a mixing equivalent ratio of epoxy group/phenol hydroxyl group=1/0.9 to 1/1.1, in the presence of a catalyst such as an alkali metal compound, an organic phosphorus compound or a cyclic amine compound, in an organic solvent of an amide type, an ether type, a ketone type, a lactone type or an alcohol type, having a boiling point of 120° C. or above, in a reaction solid content of 50 parts by weight or less, and with heating at 50 to 200° C.

The bifunctional epoxy resin may include bisphenol A epoxy resin, bisphenol F epoxy resin, bisphenol AD epoxy resin and bisphenol S epoxy resin. The bifunctional phenol is a compound having two phenolic hydroxyl groups, and may include, e.g., hydroquinones and bisphenols such as bisphenol A, bisphenol F, bisphenol AD and bisphenol S. The phenoxy resin may be modified with a radically polymerizable functional group.

(5) Conductive Particles:

The adhesive of the present invention need not particularly contain conductive particles because the electrical conduction is attained by direct contact of the wiring terminals to be connected. The conductive particles may preferably be contained because more stable connection can be attained.

Conductive particles preferable for the present invention may include particles of metals such as Au, Ag, Ni, Cu and solder, and carbon particles. In order to achieve a sufficient pot life, it is preferable that not a transition metal such as Ni or Cu but a noble metal such as Au, Ag or a platinum group metal forms their surface layers. It is particularly preferable that the surface is formed of Au. Particles comprised of a transition metal such as Ni the particle surfaces of which have been coated with a noble metal such as Au are also preferable for the present invention.

Composite particles comprised of non-conductive glass, ceramic or plastic particles on the surfaces of which conductive layers formed of the above metal have been formed to provide outermost layers formed of a noble metal, and heat-fusible metal particles are also suited for the present invention because they are deformable upon application of heat and pressure and hence the area of their contact with electrodes increases at the time of connection to bring about an improvement in reliability.

In the case when the composite particles having coat layers of a noble metal at the surfaces are used, the coat layers may preferably be provided in a thickness of 100 angstroms or more in order to attain a good resistance. Especially when the layers of a noble metal are provided on the transition metal such as Ni, the coat layers formed of a noble metal may preferably be provided in a thickness of 300 angstroms or more in order to prevent free radicals from being generated by the redox reaction caused by any defects of the noble metal layers which defects may occur when the conductive particles are mixed and dispersed, to cause a lowering of storage stability. If, however, the coat layers are provided in a thickness larger than 1 µm, the effect is no longer improved in proportion to the thickness.

Hence, in usual cases, it is preferable for the coat layers to be in a thickness of 1 µm or less, to which, however, the present invention is by no means limited.

The conductive particles may properly be used according to purpose, in the range of from 0.1 to 30 parts by volume based on 100 parts by volume of the resin component of the adhesive. In order to prevent adjoining wirings from being short-circuited by any excess conductive particles, the conductive particles may more preferably be used in an amount of from 0.1 to 10 parts by volume.

Structure in which the conductive particles are not in contact with the curing agent enables more improvement of pot life. More specifically, an adhesive film having a double or more multi-layer structure in which at least a first layer formed of the adhesive of the present invention and a second layer formed of an adhesive mixed with the conductive particles in place of the curing agent are formed in layers is preferred because a much longer pot life can be achieved.

Figure 3:
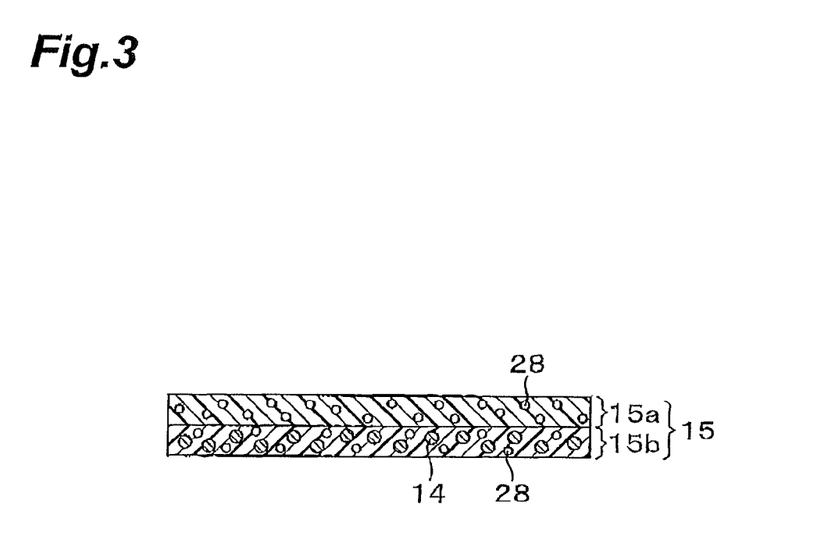
FIG. 3 shows a cross-sectional view of a wiring-terminal-connecting adhesive film according to an embodiment of the present invention, having first and second layers.

FIG. 3 shows a wiring-terminal-connecting adhesive film according to this embodiment of the present invention having a first layer and a second layer. That is, this multiple layer wiring-terminal-connecting adhesive film 15 includes a first layer 15a and a second layer 15b. The second layer 15b includes both conductive particles 14 and silicone particles 28, while the first layer includes silicone particles 28.

(6) Other Additives:

In the adhesive of the present invention, allyl acrylate and/or allyl methacrylate may optionally be mixed in order to improve bond strength. It or they may be mixed in an amount of from 0.1 to 10 parts by weight, and more preferably from 0.5 to 5 parts by weight, based on 100 parts by weight of the total weight of the radically polymerizable substance(s) (when the film-forming material is contained, based on 100 parts by weight of the total of the radically polymerizable substance(s) and the film-forming material).

If it is less than 0.1 part by weight, the effect of improving bond strength may not sufficiently be achieved. If it is more than 10 parts by weight, the radical polymerization reaction may be so low as to cause insufficient reaction to make it difficult to achieve good bond strength.

In the adhesive of the present invention, a polymer or copolymer having as a monomer component at least one of acrylic acid, an acrylate, a methacrylate and acrylonitrile may also be mixed. In particular, a copolymer acrylic rubber containing glycidyl acrylate and/or glycidyl methacrylate monomer(s) having a glycidyl ether group promises superior stress relaxation, and may preferably be contained. Such an acrylic rubber may preferably have a weight-average molecular weight of 200,000 or more in order to make the adhesive have a higher cohesive force.

In the adhesive of the present invention, a filler, a softening agent, an accelerator, an anti-aging agents, a colorant, a flame retardant, a thixotropic agent, a coupling agent, a resin (e.g., phenolic resin or melamine resin) and an isocyanate may further be mixed.

The mixing of the filler is preferable because the connection reliability and so forth are improved. In the case when the filler is used, the maximum diameter of its particles should be smaller than the particle diameter of the conductive particles.

Also, it may be mixed in an amount of from 5 to 60 parts by volume based on 100 parts by volume of the resin component in the adhesive. If it is more than 60 parts by volume, the effect of improving reliability may be saturated. If it is less than 5 parts by volume, its addition is less effective.

As the coupling agent, any of ketimine-, vinyl-group-, acrylic-group-, amino-group-, epoxy-group- and isocyanate-group-containing agents are preferable for the present invention in view of an improvement in adhesion.

As a silane coupling agent having an amino group, it may include, e.g.,
N-β-(aminoethyl)-γ-aminopropyltrimethoxysilane,
N-β-(aminoethyl)-γ-aminopropylmethyldimethoxysilane,
γ-aminopropyltriethoxysilane,
N-phenyl-γ-aminopropyltrimethoxysilane and the like.

As a silane coupling agent having a ketimine, it may include those obtained by allowing the above silane coupling agent having an amino group, to react with a ketone compound such as acetone, methyl ethyl ketone or methyl isobutyl ketone.

(7) Uses:

The adhesive of the present invention may also be used as an adhesive film used to bond IC (integrated circuit) chips to chip-mount substrates or to bond electric wirings to one another. More specifically, the adhesive of the present invention which has been shaped into a film (the adhesive film) may be interposed between a first wiring member having a first connecting terminal and a second wiring member having a second connecting terminal, and these may be heated and pressed to connect the first connecting terminal and the second connecting terminal electrically.

Wiring members preferable as members to be connected according to the present invention may include chip component parts such as semiconductor chips, resistor chips and capacitor chips, and substrate members such as printed-wiring substrates. These wiring members are provided with connecting terminals usually in a large number (may be provided with one terminal in some cases). At least one set of such wiring members is so disposed that at least part of wiring terminals provided thereon face to one another, interposing the adhesive of the present invention between these, which are then heated under application of a pressure to electrically interconnect the connecting terminals facing to one another. Thus, a wiring structure (such as a wiring board) having two or more wiring members can be manufactured.

Here, the electrical conduction between wiring terminals thus formed may be set up by direct contact between the wiring terminals or may be set up via the conductive particles contained in the adhesive.

The connection of wiring terminals according to the present invention may be performed by, e.g., forming an adhesive layer on the surface of the first connecting terminal (circuit electrode), and disposing on the surface of this adhesive layer the second connecting terminal (circuit electrode) under registration in such a way that the connecting terminals face to each other, followed by heating and pressing. The adhesive layer may be formed by, e.g., coating a liquid adhesive, or may be formed by placing the adhesive film.

(8) Physical Properties of Adhesive:

The adhesive of the present invention melts and flows at the time of connection to connect wiring terminals facing to one another, and thereafter it is cured to keep the connection. Hence, the flowability of the adhesive is an important factor. The adhesive of the present invention may preferably have a flowability of from 1.3 to 3.0, and more preferably from 1.5 to 2.5, as the value of flowability (B)/(A) represented by the initial area (A) and the area (B) after heating and pressing when the adhesive of the present invention which is of 35 μm in thickness and 5 mm×5 mm in size is interposed between two sheets of glass of 0.7 mm in thickness and 15 mm×15 mm in size and these are heated and pressed at 150° C. and 2 MPa for 10 seconds.

If the value is smaller than 1.3, the adhesive may have so poor a flowability as not to achieve any good connection.

If it is greater than 3.0, air bubbles may occur to result in a poor reliability.

The adhesive of the present invention may also preferably have a modulus of elasticity of from 100 to 3,000 MPa at 25° C. after curing, and more preferably from 300 to 2,000 MPa. When it has the modulus of elasticity in this range, the resin can have a low internal stress after connection.

Hence, this is advantageous for the improvement of adhesive force, and also can ensure good conduction performance.

The adhesive of the present invention may preferably have, in measurement with a differential scanning calorimeter (DSC) at a heating rate of 10° C./minute, an exotherm rise temperature (Ta) of from 70° C. to 110° C., a peak temperature (Tp) of Ta+5 to 30° C. and an end temperature (Te) of 160° C. or below.

EXAMPLES

A. Preparation of Adhesive

Example 1

(1) Synthesis of Urethane Acrylate:

400 parts by weight of polycaprolactone diol with an average molecular weight of 800, 131 parts by weight of 2-hydroxypropyl acrylate, 0.5 part by weight of dibutyltin dilaurate as a catalyst and 1.0 part by weight of hydroquinone monomethyl ether as a polymerization inhibitor were heated to 50° C. with stirring to mix them. Next, 222 parts by weight of isophorone diisocyanate was dropwise added thereto, and the mixture formed was further heated to 80° C. with stirring to effect urethanation reaction. Having made sure that the conversion of isocyanate groups reached 99% or more, the reaction temperature was dropped to obtain urethane acrylate A.

(2) Synthesis of Silicone Particles:

Silicone particles were obtained by adding methyltrimethoxysilane to an aqueous alcohol solution of pH 12 and kept at 20° C., with stirring at 300 rpm to effect hydrolysis and condensation. The silicone particles thus obtained had a modulus of elasticity of 8 MPa at 25° C. and an average particle diameter of 2 μm.

(3) Preparation of Conductive Particles:

Conductive particles were prepared by providing nickel layers of 0.2 μm thick on the surfaces of particles composed of polystyrene as nuclei, and providing gold layers of 0.04 μm thick on the outsides of the nickel layers. The conductive particles thus obtained had an average particle diameter of 10 μm.

(4) Preparation of Adhesive:

100 parts by weight of the silicone particles obtained in the step (2) were dispersed in 100 parts by weight of a mixed solvent of toluene/ethyl acetate of 50/50 in weight ratio.

The urethane acrylate A obtained in the step (1), a phosphate type acrylate (available from Kyoeisha Chemical Co., Ltd.; trade name: P2M), the silicone particles and t-hexyl peroxy-2-ethylhexanonate (a free radical generator) were so mixed as to be in amounts of 99 g, 1 g, 30 g and 5 g, respectively, in solid weight ratio, and 3% by volume of the conductive particles obtained in the step (3) were dispersed to obtain a liquid adhesive.

Example 2

50 g of phenoxy resin (available from Union Carbide Corporation; trade name: PKHC; average molecular weight: 45,000) was dissolved in a mixed solvent of toluene (boiling point: 110.6° C.; SP value: 8.90)/ethyl acetate (boiling point: 77.1° C.; SP value: 9.10) of 50/50 in weight ratio to form a solution with a solid content of 40% by weight.

The phenoxy resin, the urethane acrylate A, the phosphate type acrylate, the t-hexyl peroxy-2-ethylhexanonate and the silicone particles were so mixed as to be in amounts of 50 g, 49 g, 1 g, 5 g and 5 g, respectively, in solid weight ratio, and 3% by volume of the conductive particles were dispersed. The dispersion thus obtained was coated on a one-side surface-treated PET (polyethylene terephthalate) film of 80 μm thick by means of a coater, followed by drying with 70° C. hot air for 10 minutes to obtain an adhesive film of 20 μm thick.

Examples 3 to 5

Adhesive films were obtained in the same manner as in Example 2 except that the solid weight ratio of phenoxy resin/urethane acrylate A/phosphate type acrylate/silicone particles/t-hexyl peroxy-2-ethylhexanonate was changed to 50 g/49 g/1 g/20 g/5 g (Example 3), 30 g/69 g/1 g/10 g/5 g (Example 4) and 30 g/40 g/30 g/10 g/5 g (Example 5).

Comparative Example 1

An adhesive film was obtained in the same manner as in the step (4) of Example 1 except that the solid weight ratio of urethane acrylate A/phosphate type acrylate/t-hexyl peroxy-2-ethylhexanonate was changed to 99 g/1 g/5 g and the silicone particles were not mixed.

Comparative Example 2

An adhesive film was obtained in the same manner as in Example 2 except that the silicone particles were not used.

Figure 1:
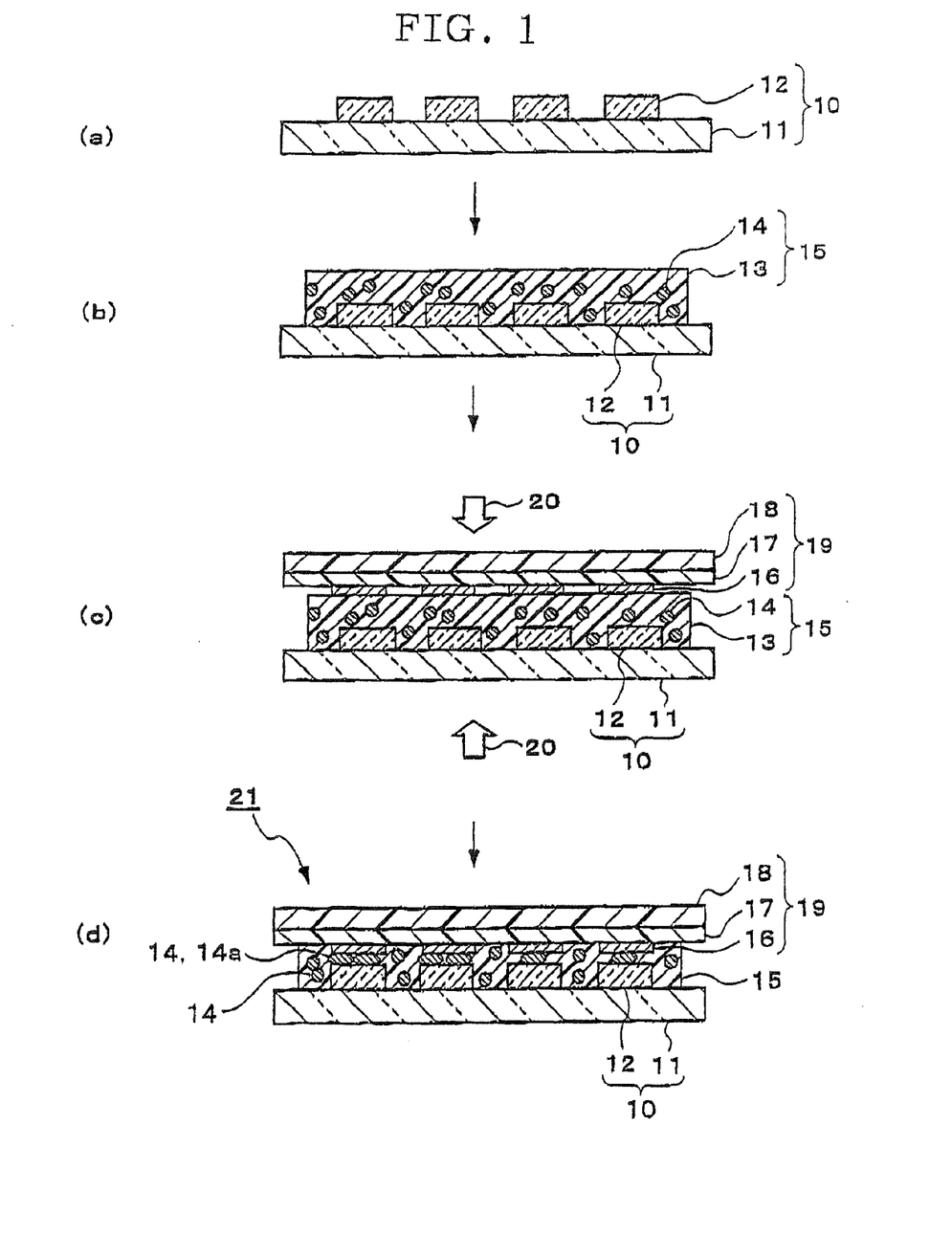
FIGS. 1 and 2 are illustrations showing the steps of connecting wiring terminals.

B. Evaluation of Adhesive:

(1) Production of Wiring Structure:

First, on the surface of a glass substrate 11 of 1.1 mm thick, wirings 12 of indium-tin oxide (ITO) were formed by vacuum deposition to prepare an ITO substrate member (surface resistivity: <20 Ω/square) 10 [FIG. 1 (a)]. On its side where the wiring 12 was formed, an adhesive layer 15 formed of an adhesive 13 containing conductive particles 14 (the one prepared in each Example and Comparative Example) was formed [FIG. 1 (b)].

In Example 1 and Comparative Example 1, in which the adhesive was liquid, the adhesive layer 15 was formed by coating the adhesive. In Examples 2 to 5 and Comparative Example 2, in which the adhesive was filmy, it was formed by fastening the adhesive to the wiring member, heating and pressing them at 70° C. and 0.5 MPa for 5 seconds to effect provisional connection, and thereafter peeling the PET film off.

On the surface of this adhesive layer 15, a flexible wiring board (a triple-layer FPC) was placed which was prepared by bonding a polyimide layer 18 and copper foil (thickness: 18 μm) with an adhesive 17 and subjecting the copper foil to patterning to form wirings 16 of 50 μm in line width and 100 μm in pitch, and these were heated and pressed at 160° C. and 3 MPa for 10 seconds to make connection over a width of 2 mm. Thus, a wiring structure 21 shown in FIG. 1 (d) was obtained.

Figure 2:
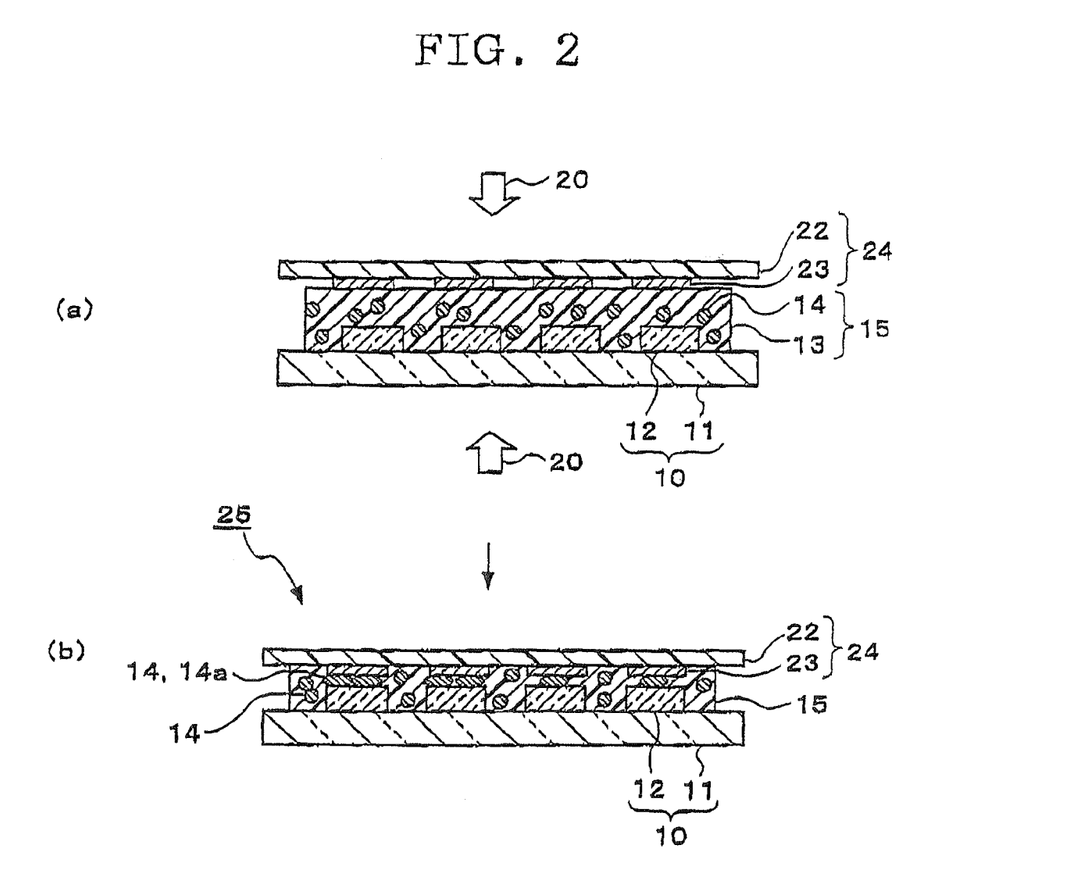

A wiring structure 25 was also obtained [FIG. 2 (b)] by making connection to the ITO substrate member in the same way but using, in place of the triple-layer FPC, a flexible wiring board (a double-layer FPC) 24 prepared by forming on the surface of a polyimide film (thickness: 100 μm) 22 a copper circuit 23 with 500 wirings of 50 μm in line width, 100 μm in pitch and 18 μm in thickness [FIG. 2 (a)].

(2) Measurement of Connection Resistance:

After the wiring structures were produced in the manner as described above, their resistance value between adjoining circuits of the FPCs including wiring-connected portions was measured with a multi-meter immediately after the production. These were further kept in a high-temperature high-humidity chamber of 85° C. and 85% RH for 500 hours, and thereafter the resistance value was measured in the same way. Here, the resistance value was shown as the average of 150 points of resistance between adjoining circuits.

(3) Measurement of Bond Strength:

The wiring structures produced in the manner as described above were put to a peel test of peeling at 90 degrees at a peel rate of 50 mm/minute, to measure their bond strength.

(4) Evaluation of Insulation Properties:

First, a printed-wiring substrate having a comb-shaped circuit in which a copper circuit with 250 wirings provided alternately in a line width of 50 μm, a pitch of 100 μm and a thickness of 18 μm was prepared. On its side where the circuit was formed, an adhesive layer was formed in the same manner as the above (1). Next, on the surface of this adhesive layer, a flexible wiring board (FPC) having a copper circuit with 500 wirings of 50 μm in line width, 100 μm in pitch and 18 μm in thickness was placed, and these were heated and pressed at 160° C. and 3 MPa for 10 seconds to make connection over a width of 2 mm. Thus, a wiring structure was obtained. To the comb-shaped circuit of this wiring structure, a voltage of 100 V was applied to measure insulation resistance value. The wiring structure was further put to a high-temperature high-humidity test of 85° C. and 85% RH for 500 hours, and thereafter the insulation resistance value was measured.

(5) Evaluation of Flowability:

An evaluation-purpose adhesive of 5 mm×5 mm in size and 35 μm in thickness was sandwiched between two sheets of glass of 15 mm×15 mm in size and 0.7 mm in thickness, and these were heated and pressed at 150° C. and 2 MPa for 10 seconds, where the value of flowability (B)/(A) was determined on the basis of the initial area (A) and the area (B) after heating and pressing.

(6) Modulus of Elasticity after Curing:

The liquid adhesives (Example 1 and Comparative Example 1) were each casted into a mold, and then heated at 160° C. for 1 minute to effect curing to obtain a rod-like cured product. The filmy adhesives (Examples 2 to 5 and Comparative Example 2) were each immersed in 160° C. oil for 1 minute to effect curing to obtain a film-like cured product. The storage elastic modulus of each of these cured products was measured with a dynamic viscoelastometer (heating rate: 5° C./minute; 10 Hz) to determine the modulus of elasticity at 25° C.

(7) Measurement by DSC:

Using the adhesives obtained in the respective Examples and Comparative Examples, the rise temperature (Ta), peak temperature (Tp) and end temperature (Te) of exothermic reaction were determined by means of a differential scanning calorimeter (DSC, manufactured by TA Instruments Co.; trade name: Model 910). In the measurement, the heating rate was set at 10° C./minute.

C. Results:

The results obtained by the above evaluation methods are shown in Table 1.

TABLE 1

| Adhensive composition | | | Example | | | | | Comparative Example | |
|---|---|---|---|---|---|---|---|---|---|
| | | | 1 | 2 | 3 | 4 | 5 | 1 | 2 |
| Adhesive Force (N/m) | Double-layer FPC | Initial stage | 400 | 700 | 750 | 650 | 680 | 50 | 100 |
| | | After moisture absorption | 200 | 400 | 550 | 450 | 400 | 10 | 20 |
| | Triple-layer FPC | Initial stage | 900 | 1200 | 1300 | 1100 | 1250 | 600 | 700 |
| | | After moisture absorption | 600 | 900 | 1000 | 1000 | 950 | 300 | 500 |
| Connection resistance (Ω) | | Initial stage | 0.9 | 1.2 | 1.7 | 1.1 | 1.2 | 0.9 | 1.2 |
| | | After moisture absorption | 1.3 | 1.4 | 1.8 | 1.3 | 1.3 | 1.3 | 1.4 |
| Insulation resistance(Ω) | | | >$10^9$ | >$10^9$ | >$10^9$ | >$10^9$ | >$10^9$ | >$10^9$ | >$10^9$ |
| Flowability(%) | | | 2.5 | 1.9 | 1.7 | 1.8 | 1.9 | 2.6 | 1.8 |
| Modulus of elasticity(MPa) | | | 500 | 800 | 700 | 800 | 800 | 600 | 700 |
| DSC(° C.) | | Ta | 88 | 87 | 90 | 89 | 89 | 87 | 88 |
| | | Tp | 105 | 108 | 107 | 109 | 108 | 104 | 107 |
| | | Te | 140 | 148 | 147 | 147 | 148 | 143 | 148 |

The silicone particles are not contained in the adhesives of Comparative Examples 1 and 2. In contrast thereto, in Examples 1 to 5, in which the silicone particles are mixed, the adhesive force is greatly improved compared with that in Comparative Examples, even in the case of the double-layer FPC in which the polyimide resin stands uncovered to the surface of the substrate which supports connecting terminals and also in the case of the triple-layer FPC in which the adhesive stands uncovered thereto. The adhesive force after moisture absorption is also great.

POSSIBILITY OF INDUSTRIAL APPLICATION

As described above, according to the present invention, a high bond strength can be achieved and a wiring structure having a high connection reliability can be produced, even in the case of the wiring member in which the substrate which supports wiring terminals is made of an insulating organic matter such as polyimide resin, or glass, or in the case of the wiring member having silicon nitride, silicone resin and/or polyimide resin at its surface.

What is claimed is:

1. A wiring-terminal-connecting adhesive film comprising:
a first layer of the adhesive film, formed of a composition containing (1) a curing agent capable of generating a free radical upon heating, (2) a radically polymerizable substance and (3) silicone particles; and
a second layer of the adhesive film, separate from the first laver, formed of a composition containing (4) conductive particles, (2) a radically polymerizable substance and (3) silicone particles.

2. The wiring-terminal-connecting adhesive film according to claim 1, wherein said second layer contains said conductive particles and does not contain said curing agent.

3. The wiring-terminal-connecting adhesive film according to claim 1, wherein the first layer is adjacent the second layer in the adhesive film.

4. The wiring-terminal-connecting adhesive film according to claim 1, wherein the conductive particles, contained in the second layer, are not in contact with the curing agent, contained in the first layer.

5. The wiring-terminal-connecting adhesive film according to claim 1, wherein said silicone particles are contained in an amount of from 5 parts by weight to 200 parts by weight based on the weight of said radically polymerizable substance.

6. The wiring-terminal-connecting adhesive film according to claim 1, wherein said electrically conductive particles have at least one of gold, silver, Ni, Cu, solder, carbon and a platinum group metal at least at the surface thereof.

7. The wiring-terminal-connecting adhesive film according to claim 1, wherein the radically polymerizable substance includes, as a part thereof, a radically polymerizable substance having a phosphoric ester structure represented by the following chemical formula (1):

wherein n is 1, 2 or 3.

8. The wiring-terminal-connecting adhesive film according to claim 1, wherein said electrically conductive particles are included in the adhesive film in an amount of 0.1 to 30 parts by volume of resin component of the adhesive film.

9. The wiring-terminal-connecting adhesive film according to claim 1, having a flowability of 1.3 to 3.0 as a value of flowability (B)/(A) represented by initial area (A) and the area (B) after heating and pressing, at 150° C. and 2 MPa for 10 second, an adhesive 35 μm in thickness and 5 mm×5 mm in size interposed between two sheets of glass of 0.7 mm in thickness and 15 mm×15 mm in size.

10. The wiring-terminal-connecting adhesive film according to claim 1, having the property that it can be used to electrically connect wiring terminals by (1) interposing said adhesive film between wiring substrates which are disposed so that said wiring terminals on faces of respective wiring substrates face each other, and (2) heating said wiring substrates under application of a pressure.

11. The wiring-terminal-connecting adhesive film according to claim 1, wherein the silicone particles have a functional group selected from the group consisting of a hydroxyl group, an epoxy group, a ketimine, a carboxyl group and a mercapto group at a molecular terminal or on a side chain in the molecule.

12. The wiring-terminal-connecting adhesive film according to claim 1, wherein the silicone particles have been treated with a silane coupling agent.

13. The wiring-terminal-connecting adhesive film according to claim 1, wherein the silicone particles have a modulus of elasticity, at 25° C., of from 1 to 30 MPa.

* * * * *